United States Patent
Ishizaki (10) Patent No.: US 10,677,860 B2
(45) Date of Patent: Jun. 9, 2020

(54) MAGNETIC SENSOR

(71) Applicant: KABUSHIKI KAISHA TOKAI-RIKA-DENKI-SEISAKUSHO, Aichi (JP)

(72) Inventor: Yoichi Ishizaki, Aichi (JP)

(73) Assignee: KABUSHIKI KAISHA TOKAI-RIKA-DENKI-SEISAKUSHO, Aichi-Ken (JP)

( * ) Notice: Subject to any disclaimer, the term of this patent is extended or adjusted under 35 U.S.C. 154(b) by 0 days.

(21) Appl. No.: 16/116,385

(22) Filed: Aug. 29, 2018

(65) Prior Publication Data

US 2019/0072620 A1    Mar. 7, 2019

(30) Foreign Application Priority Data

Sep. 1, 2017   (JP) .................................. 2017-168559

(51) Int. Cl.
  *G01R 33/09*    (2006.01)
  *H01L 43/08*    (2006.01)
  *H01L 43/02*    (2006.01)

(52) U.S. Cl.
  CPC ......... *G01R 33/093* (2013.01); *G01R 33/096* (2013.01); *H01L 43/02* (2013.01); *H01L 43/08* (2013.01)

(58) Field of Classification Search
  CPC ..... G01R 33/093; G01R 33/096; H01L 43/08; H01L 43/02
  See application file for complete search history.

(56) References Cited

U.S. PATENT DOCUMENTS

2008/0218163  A1*  9/2008  Hosomi ................. B82Y 25/00
                                            324/252

FOREIGN PATENT DOCUMENTS

JP    2007309694 A  * 11/2007
JP    2009025074 A     2/2009

* cited by examiner

*Primary Examiner* — Bilkis Jahan
*Assistant Examiner* — Victor V Barzykin
(74) *Attorney, Agent, or Firm* — Roberts Calderon Safran & Cole P.C.

(57) ABSTRACT

A magnetic sensor includes a magnetoresistive body that is disposed over a surface of an insulator, a protective film that is provided over a surface of the insulator, including over the magnetoresistive body, and an open portion that runs along at least a portion of a perimeter of the magnetoresistive body and penetrates the protective film in a thickness direction of the protective film. In the magnetic sensor, a separation distance between an inside wall of the open portion and the magnetoresistive body, this being a minimum distance with respect to the magnetoresistive body, is configured so as to be longer than an alignment margin dimension of the open portion with respect to the magnetoresistive body.

7 Claims, 9 Drawing Sheets

FIG. 9B

MAGNETIC SENSOR

CROSS-REFERENCE TO RELATED APPLICATION

This application is based on and claims priority under 35 USC 119 from Japanese Patent Application No. 2017-168559 filed on Sep. 1, 2017, the disclosure of which is incorporated by reference herein.

BACKGROUND

Technical Field

The present invention relates to a magnetic sensor, and particularly relates to technology effective when applied to a magnetic sensor employing a magnetoresistive (MR) element.

Related Art

Japanese Patent Application Laid-Open (JP-A) No. 2009-25074 discloses a magnetic sensor. In this magnetic sensor, a magnetoresistive film is formed on the surface of a base insulating film on a substrate, and a protective film is formed over the magnetoresistive film. MR elements are configured from the magnetoresistive film. The protective film has a high resistance to oxidation and, for example, serves as an excellent barrier against impurities. Either a silicon oxide film or a silicon nitride film is employed therefor.

In this magnetic sensor, stress relief openings are formed around the magnetoresistive film. These stress relief openings pass through the protective film in the thickness direction thereof. The stress relief openings relieve stress applied to the magnetoresistive film by the protective film, and prevent a drop in the performance of the magnetic sensor.

Highly accurate performance is demanded of this magnetic sensor, even in harsh high temperature or high humidity environments. It is thus necessary to forestall the ingress of moisture to the magnetoresistive film through the stress relief openings, and to minimize variation in the durability of the magnetic sensor characteristics.

SUMMARY

In consideration of the above circumstances, the present invention provides a magnetic sensor that effectively suppresses or prevents the ingress of moisture to a magnetoresistive body through an open portion in a protective film, and that is capable of minimizing variation in the durability of the magnetic sensor characteristics.

A magnetic sensor according to a first aspect of the present invention includes a magnetoresistive body that is disposed over a surface of an insulator, a protective film that is provided over a surface of the insulator, including over the magnetoresistive body, and an open portion that runs along at least a portion of a perimeter of the magnetoresistive body and penetrates the protective film in a thickness direction. A separation distance between an inside wall of the open portion and the magnetoresistive body, this being a minimum distance with respect to the magnetoresistive body, is configured so as to be longer than an alignment margin dimension of the open portion with respect to the magnetoresistive body.

In the magnetic sensor according to the first aspect, the magnetoresistive body is disposed over the surface of the insulator, and the protective film is provided over the surface of the insulator, including over the magnetoresistive body. The open portion is provided in the protective film so as to run along at least a portion of the perimeter of the magnetoresistive body, and the open portion penetrates the protective film in the thickness direction.

The separation distance between the inside wall of the open portion and the magnetoresistive body is the minimum distance with respect to the magnetoresistive body, and is configured so as to be longer than the alignment margin dimension of the open portion with respect to the magnetoresistive body. Namely, a path of ingress for moisture from the open portion to the magnetoresistive body along an interface between the insulator and the protective film is lengthened. This thereby enables moisture ingress to be effectively suppressed or prevented, and enables variation in the durability of the characteristics of the magnetoresistive body to be minimized.

A magnetic sensor according to a second aspect of the present invention is the magnetic sensor according to the first aspect, wherein the separation distance between the inside wall and the magnetoresistive body is greater than or equal to 7 μm.

In the magnetic sensor according to the second aspect, the separation distance between the inside wall of the open portion and the magnetoresistive body is greater than or equal to 7 μm. This thereby enables moisture ingress from the open portion to the magnetoresistive body to be effectively suppressed.

A magnetic sensor according to a third aspect of the present invention includes a magnetoresistive body that is disposed over a surface of an insulator, a protective film that is provided over a surface of the insulator, including over the magnetoresistive body, an open portion that runs along at least a portion of a perimeter of the magnetoresistive body and penetrates the protective film in a thickness direction, and a dam portion that is disposed between the insulator and the protective film at an intermediate position between the magnetoresistive body and the open portion, so as to hold back the ingress of moisture from the open portion to the magnetoresistive body along an interface between the insulator and the protective film.

In the magnetic sensor according to the third aspect, the magnetoresistive body is disposed over the surface of the insulator, and the protective film is provided over the surface of the insulator, including over the magnetoresistive body. The open portion is provided in the protective film so as to run along at least a portion of the perimeter of the magnetoresistive body, and the open portion penetrates the protective film in the thickness direction.

The dam portion is disposed between the insulator and the protective film at an intermediate position between the magnetoresistive body and the open portion. The dam portion hold back the ingress of moisture from the open portion to the magnetoresistive body along the interface between the insulator and the protective film. This thereby enables moisture ingress to be effectively suppressed or prevented, and enables variation in the durability of the characteristics of the magnetoresistive body to be minimized.

A magnetic sensor according to a fourth aspect of the present invention is the magnetic sensor according to the third aspect, wherein the dam portion is formed in the same layer as, and from the same material as, the magnetoresistive body.

In the magnetic sensor according to the fourth aspect, the dam portion is formed in the same layer as, and from the same material as, the magnetoresistive body. Accordingly, there is no need to provide a new configuration separate to the magnetoresistive body. This enables the structure to be kept simple.

Moreover, in a manufacturing process for the magnetic sensor, since the dam portion and the magnetoresistive body are formed in the same manufacturing step, an increase in the number of manufacturing steps can be avoided.

The magnetic sensor according to the present invention exhibits the excellent advantageous effects of enabling moisture ingress from the open portion in the protective film to the magnetoresistive body to be effectively suppressed or prevented, and enabling variation in the durability of the magnetic sensor characteristics to be minimized.

BRIEF DESCRIPTION OF THE DRAWINGS

Exemplary embodiments of the present invention will be described in detail based on the following figures, wherein.

DETAILED DESCRIPTION

First Exemplary Embodiment

Explanation follows regarding a magnetic sensor according to a first exemplary embodiment of the present invention, with reference to FIG. 1 to FIG. 5.

Magnetic Sensor Layout Configuration

Figure 1:
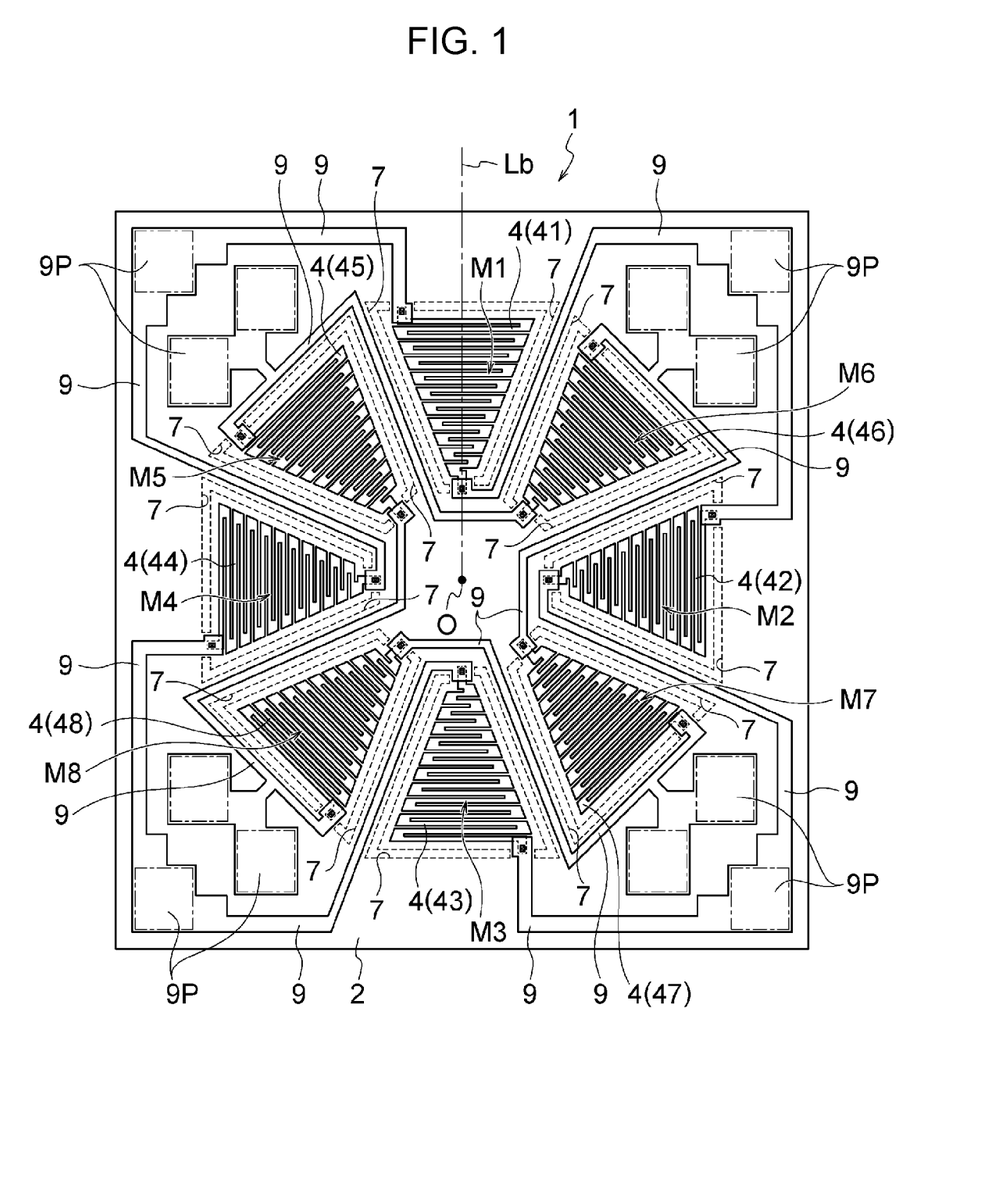
FIG. 1 is a plan view illustrating the overall layout of a magnetic sensor according to a first exemplary embodiment of the present invention.

As illustrated in FIG. 1, a magnetic sensor 1 according to the present exemplary embodiment includes a first bridge circuit and a second bridge circuit centrally disposed on a main face of a substrate 2. The first bridge circuit is configured including four MR elements M1 to M4. The second bridge circuit is similarly configured including four MR elements M5 to M8.

Plural terminals 9P are disposed at peripheral corners of the main face of the substrate 2. In each corner of the substrate 2, three terminals 9P are disposed connected to non-illustrated bonding wire, giving a total of twelve terminals 9P disposed in the four corners of the substrate 2. The bonding wire is bonded to the terminals 9P through bonding openings, outlines of which are illustrated using dashed lines. The bonding openings are formed so as to pass through a protective film 10, illustrated in FIG. 4, in the thickness direction of the protective film 10.

The MR element M1 forming the first bridge circuit is disposed toward the upper side of FIG. 1. The MR element M3 is disposed toward the lower side, at a position having point symmetry with the MR element M1 about a center position O of the substrate 2. The overall planar profile of the MR element M1 is formed substantially in the shape of an isosceles triangle that spreads in a radial pattern from the center position O toward an upper perimeter in plan view. The planar profile of the MR element M3 is formed substantially in the shape of an isosceles triangle that spreads in a radial pattern from the center position O toward a lower perimeter.

The MR element M2 is disposed on the right side, and the MR element M4 is disposed on the left side, at a position having point symmetry with the MR element M2 about the center position O. The planar profile of the MR element M2 is formed substantially in the shape of an isosceles triangle that spreads in a radial pattern from the center position O toward a right perimeter. The planar profile of the MR element M4 is formed substantially in the shape of an isosceles triangle that spreads in a radial pattern from the center position O toward a left perimeter.

Moving in a clockwise direction about the center position O from an imaginary base line Lb running from the center position O and passing through the left-right direction center of the MR element M1, the MR element M1 is arranged is at an angle of 0° with respect to the base line Lb. The MR element M2 is arranged at an angle of 90° with respect to the base line Lb, the MR element M3 is arranged at an angle of 180° with respect to the base line Lb, and the MR element M4 is arranged at an angle of 270° with respect to the base line Lb.

The MR element M5 forming the second bridge circuit is disposed between the MR element M1 and the MR element M4, and the MR element M7 is disposed between the MR element M2 and the MR element M3 at a position having point symmetry with the MR element M5 about the center position O. The MR element M6 is disposed between the MR element M1 and the MR element M2, and the MR element M8 is disposed between the MR element M3 and the MR element M4 at a position having point symmetry with the MR element M6 about the center position O. Similarly to the MR elements M1 to M4, each of the MR elements M5 to M8 has a planar profile formed substantially in the shape of an isosceles triangle.

Moving in a clockwise direction about the center position O from the base line Lb, the MR element M5 is arranged is at an angle of 315° with respect to the base line Lb, the MR element M6 is arranged at an angle of 45° with respect to the base line Lb, the MR element M7 is arranged at an angle of 135° with respect to the base line Lb, and the MR element M8 is arranged at an angle of 225° with respect to the base line Lb.

The MR elements M5 to M8 are arranged at positions respectively offset by 45° in the clockwise direction about the center position O with respect to the MR elements M1 to M4. The planar profiles of the MR elements M1 to M8 form a substantially regular octagon in plan view.

In plan view, the MR element M1 illustrated in FIG. 1 is configured by a magnetoresistive body 41 formed in a meander shape that snakes back and forth toward the left and right on progression from the center position O toward the perimeter of the substrate 2. The left-to-right extension length of the magnetoresistive body 41 gradually increases on progression from the center position O toward the perimeter. On a peripheral edge side, one end of the magnetoresistive body 41 is connected through a connection hole 8 to one end of a wiring 9 leading toward the peripheral edge in a layer above the magnetoresistive body 41 (see FIG. 2). Another end of this wiring 9 is connected to a terminal 9P arranged in upper-left corner of the substrate 2.

Figure 2:
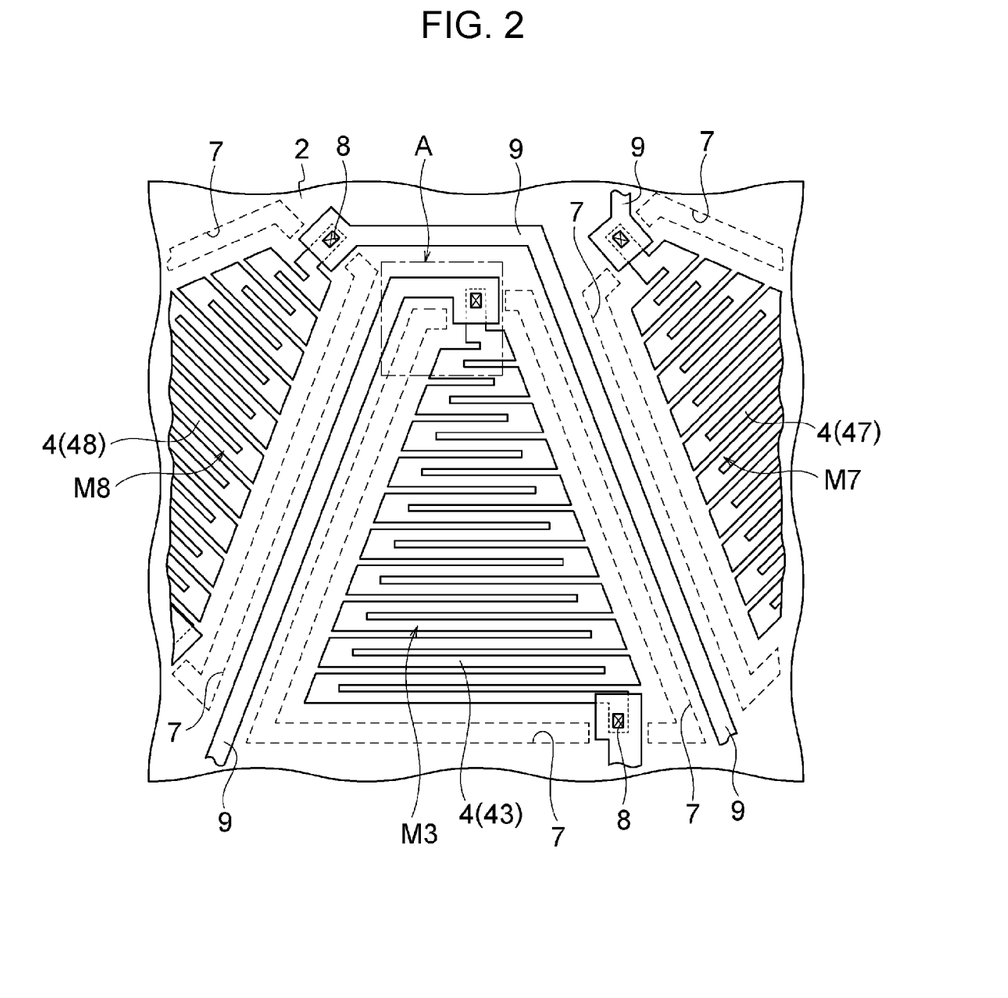
FIG. 2 is an enlarged plan view illustrating relevant portions of part of the magnetic sensor illustrated in FIG. 1.
Figure 3:
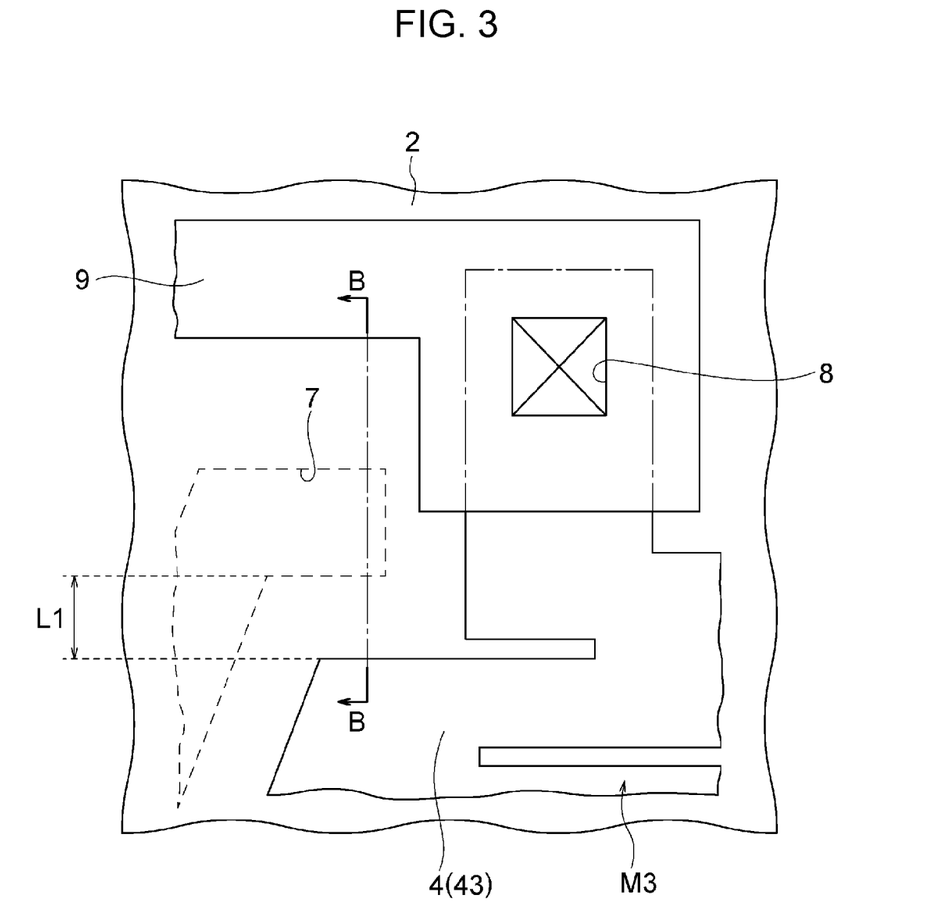
FIG. 3 is an even further enlarged plan view illustrating relevant portions in the region marked by the dashed line labeled A in FIG. 2.

On the center position O side, another end of the magnetoresistive body 41 is connected through a connection hole 8 to one end of a wiring 9 that runs between the MR element M1 and the MR element M6 toward the peripheral edge side (see FIG. 2 and FIG. 3). Another end of this wiring 9 is connected to a terminal 9P arranged in an upper-right corner of the substrate 2.

The MR element M2 is configured by a magnetoresistive body 42 that has a planar profile identical to that of the magnetoresistive body 41. On the peripheral edge side, one end of the magnetoresistive body 42 is connected through a connection hole 8 to one end of a wiring 9 leading toward the peripheral edge. Another end of this wiring 9 is connected to a terminal 9P that is arranged in the upper-right corner of the substrate 2. This terminal 9P is the same terminal 9P that is connected to the other end of the magnetoresistive body 41.

On the center position O side, another end of the magnetoresistive body 42 is connected through a connection hole 8 to one end of a wiring 9 that runs between the MR element M2 and the MR element M7 toward the peripheral edge side. Another end of this wiring 9 is connected to a terminal 9P arranged in a lower-right corner of the substrate 2.

The MR element M3 is configured by a magnetoresistive body 43 that has a planar profile identical to that of the magnetoresistive body 41. On the peripheral edge side, one end of the magnetoresistive body 43 is connected through a connection hole 8 to one end of a wiring 9 leading toward the peripheral edge. Another end of this wiring 9 is connected to a terminal 9P that is arranged in the lower-right corner of the substrate 2. This terminal 9P is the same terminal 9P that is connected to the other end of the magnetoresistive body 42.

On the center position O side, another end of the magnetoresistive body 43 is connected through a connection hole 8 to one end of a wiring 9 that runs between the MR element M3 and the MR element M8 toward the peripheral edge side. Another end of this wiring 9 is connected to a terminal 9P arranged in a lower-left corner of the substrate 2.

The MR element M4 is configured by a magnetoresistive body 44 that has a planar profile identical to that of the magnetoresistive body 41. On the peripheral edge side, one end of the magnetoresistive body 44 is connected through a connection hole 8 to one end of a wiring 9 leading toward the peripheral edge. Another end of this wiring 9 is connected to a terminal 9P that is arranged in the lower-left corner of the substrate 2. This terminal 9P is the same terminal 9P that is connected to the other end of the magnetoresistive body 43.

On the center position O side, another end of the magnetoresistive body 44 is connected through a connection hole 8 to one end of a wiring 9 that runs between the MR element M4 and the MR element M5 toward the peripheral edge side. Another end of this wiring 9 is connected to a terminal 9P arranged in the upper-left corner of the substrate 2. This terminal 9P is the same terminal 9P that is connected to the one end of the magnetoresistive body 41.

The MR element M5 is configured by a magnetoresistive body 45 that has a planar profile identical to that of the magnetoresistive body 41. On the peripheral edge side, one end of the magnetoresistive body 45 is connected through a connection hole 8 to one end of a wiring 9 leading toward the peripheral edge. Another end of this wiring 9 is connected to a terminal 9P arranged in the upper-left corner of the substrate 2.

On the center position O side, another end of the magnetoresistive body 45 is connected through a connection hole 8 to one end of a wiring 9 that runs between the MR element M8 and the MR element M4 toward the peripheral edge side. Another end of this wiring 9 is connected to a terminal 9P disposed at the lower-left corner of the substrate 2.

The MR element M6 is configured by a magnetoresistive body 46 that has a planar profile identical to that of the magnetoresistive body 41. On the peripheral edge side, one end of the magnetoresistive body 46 is connected through a connection hole 8 to one end of a wiring 9 leading toward the peripheral edge. Another end of this wiring 9 is connected to a terminal 9P arranged in the upper-right corner of the substrate 2.

On the center position O side, another end of the magnetoresistive body 46 is connected through a connection hole 8 to one end of a wiring 9 that runs between the MR element M5 and the MR element M1 toward the peripheral edge side. Another end of this wiring 9 is connected to a terminal 9P arranged in the upper-left corner of the substrate 2. This terminal 9P is the same terminal 9P that is connected to the one end of the magnetoresistive body 45.

The MR element M7 is configured by a magnetoresistive body 47 that has a planar profile identical to that of the magnetoresistive body 41. On the peripheral edge side, one end of the magnetoresistive body 47 is connected through a connection hole 8 to one end of a wiring 9 leading toward the peripheral edge. Another end of this wiring 9 is connected to a terminal 9P arranged in the lower-right corner of the substrate 2.

On the center position O side, another end of the magnetoresistive body 47 is connected through a connection hole 8 to one end of a wiring 9 that runs between the MR element M6 and the MR element M2 toward the peripheral edge side. Another end of this wiring 9 is connected to a terminal 9P arranged in the upper-right corner of the substrate 2. This terminal 9P is the same terminal 9P that is connected to the one end of the magnetoresistive body 46.

The MR element M8 is configured by a magnetoresistive body 48 that has a planar profile identical to that of the magnetoresistive body 41. On the peripheral edge side, one end of the magnetoresistive body 48 is connected through a connection hole 8 to one end of a wiring 9 leading toward the peripheral edge. Another end of this wiring 9 is connected to a terminal 9P arranged in the lower-left corner of the substrate 2. This terminal 9P is the same terminal 9P that is connected to the other end of the magnetoresistive body 45.

On the center position O side, another end of the magnetoresistive body 48 is connected through a connection hole 8 to one end of a wiring 9 that runs between the MR element M7 and the MR element M3 toward the peripheral edge side. Another end of this wiring 9 is connected to a terminal 9P arranged in the lower-right corner of the substrate 2. This terminal 9P is the same terminal 9P that is connected to the one end of the magnetoresistive body 47.

Note that in the following description, the magnetoresistive bodies 41 to 48 are also collectively referred to as magnetoresistive bodies 4.

Magnetic Sensor: Vertical Cross-Section Structure

Figure 4:
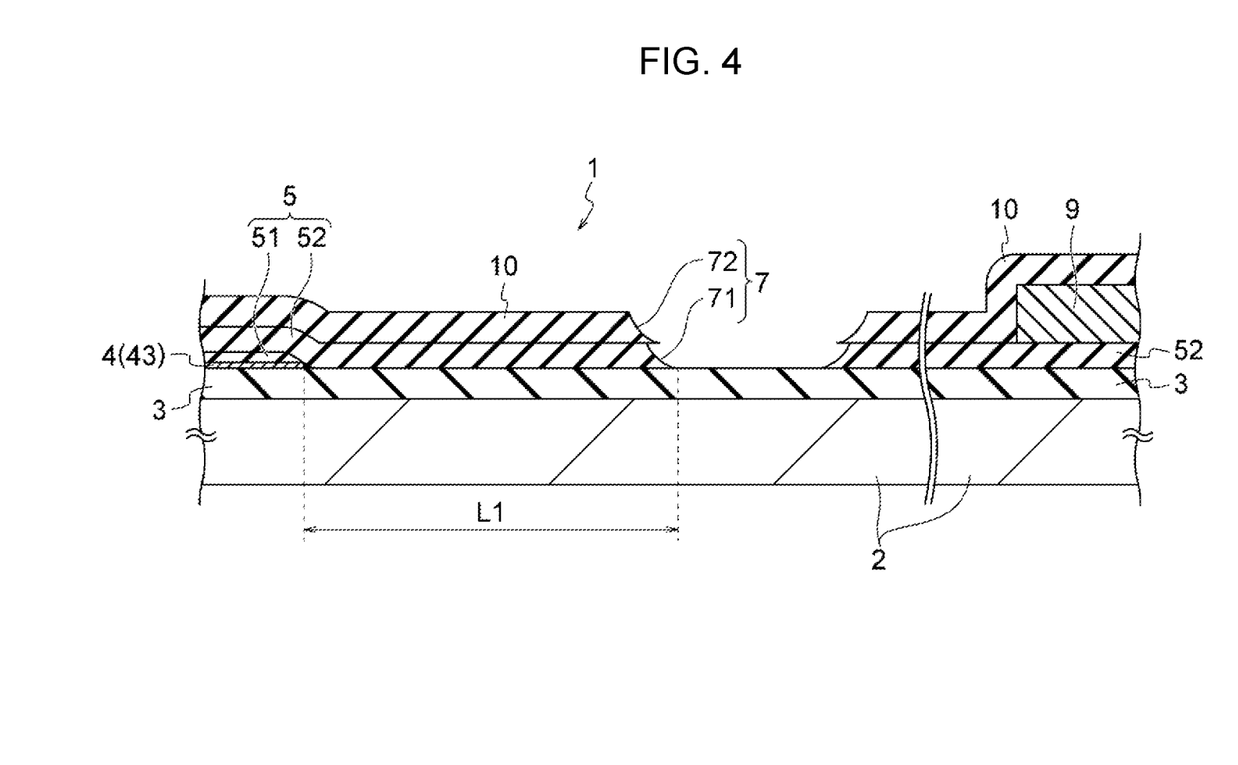
FIG. 4 is an enlarged cross-section view of relevant portions of the magnetic sensor taken along line B-B illustrated in FIG. 3.

As illustrated in FIG. 4, an insulator 3 is formed over the entire surface of the substrate 2, and the magnetoresistive bodies 4 are formed on the surface of the insulator 3. A protective film 5 is formed over the magnetoresistive bodies 4, and the wirings 9 and the terminals 9P (see FIG. 1) are formed over the protective film 5. The protective film 10 is then formed over the wirings 9 and the terminals 9P.

In the present exemplary embodiment, a monocrystalline silicon substrate is employed for the substrate 2. A silicon oxide film forms the insulator 3.

A magnetic film, such as a nickel-cobalt (Ni—Co) film or a nickel-iron (Ni—Fe) film, is employed for the magnetoresistive bodies 4. The thickness of the magnetoresistive bodies 4 is, for example, set from 25 nm to 50 nm. The magnetoresistive bodies 4 are, for example, formed by sputtering, and are patterned using photolithography. Of the magnetoresistive bodies 4, only the magnetoresistive body 43 of the MR element M3 is illustrated in FIG. 4. However, the magnetoresistive bodies 41 to 48 are all formed in the same electrically conductive layer and are all formed from the same material.

In the present exemplary embodiment, the protective film 5 is formed including a first protective film 51 and a second protective film 52.

The first protective film 51 is formed over the magnetoresistive bodies 4, and has a planar profile identical to that of the magnetoresistive bodies 4 in plan view. The first protective film 51 electrically insulates the magnetoresistive bodies 4 from the wirings 9, and is also employed as a hardmask for patterning the magnetoresistive bodies 4 in a manufacturing process of the magnetic sensor 1. A silicon nitride ($Si_3N_4$) film formed by plasma-enhanced chemical vapor deposition (CVD), for example, is employed as the first protective film 51. The thickness of the silicon nitride film is, for example, set from 150 nm to 250 nm.

The second protective film 52 is formed over the entire surface of the substrate 2, including over the magnetoresistive bodies 4 and the first protective film 51. The second protective film 52 electrically insulates the magnetoresistive bodies 4 from the wirings 9, and protects the magnetoresistive bodies 4 from the outside environment. Similarly to the first protective film 51, a silicon nitride film formed, for example, by plasma-enhanced CVD is employed as the second protective film 52. The thickness of the silicon nitride film is, for example, set from 250 nm to 350 nm. Compared to silicon oxide films, silicon nitride films have greater mechanical hardness and have better moisture absorption.

Note that a silicon oxide ($SiO_2$) film may be employed as the protective film 5, or a composite film in which a silicon nitride film and a silicon oxide film are stacked on one another may be employed as the protective film 5.

The wirings 9 and the terminals 9P (see FIG. 1) are formed in the same electrically conductive layer and are formed from the same material. For example, an aluminum alloy film is employed for the wirings 9 and the terminals 9P. An aluminum alloy film to which, for example, silicon (Si) to suppress alloy spikes, copper (Cu) to suppress migration, or the like has been added to aluminum, is employed as the aluminum alloy film. The thickness of the wirings 9 is, for example, set from 700 nm to 900 nm.

A silicon nitride film formed by plasma-enhanced CVD, for example, is employed as the protective film 10. The thickness of this silicon nitride film is, for example, set from 450 nm to 550 nm.

Configuration of Open Portions

As illustrated in FIG. 2 to FIG. 4, open portions 7 that penetrate the protective film 5 and the protective film 10 along their thickness directions are disposed running along at least a portion of the perimeter of each magnetoresistive body 4. The open portions 7 are formed in trench shapes extending along the perimeter of the magnetoresistive bodies 4, except for at connection portions between the magnetoresistive bodies 4 and the wirings 9.

Detailed explanation follows regarding the open portions 7 disposed running along the MR element M3 illustrated in FIG. 2 and FIG. 3. As described above, the MR element M3 has a substantially isosceles triangle shaped planar profile that spreads in a radial pattern from the center position O (see FIG. 1) toward the lower perimeter of the substrate 2. The magnetoresistive body 43 snakes back and forth as it runs from the center position O toward the perimeter, thereby forming the planar profile of the MR element M3. The open portions 7 are provided extending along the two equal sides of the isosceles triangle and the one bottom side of the isosceles triangle so as to run parallel to the equal sides and the bottom side. The trench width of the open portions 7 is uniform along extending portions of the open portions 7, but not at bend portions of the open portions 7.

In FIG. 2, on the center position O side, one end portion of the open portion 7 extending along the equal side on the left bends toward the right toward a connection portion between the magnetoresistive body 43 and the wiring 9. At the lower perimeter, another end portion of this open portion 7 bends toward the right and extends along the bottom side as far as a perimeter-side connection portion between the magnetoresistive body 43 and the wiring 9. This open portion 7 is formed with a substantially L-shaped profile in plan view. The open portion 7 extending along the equal side on the left is disposed alongside the magnetoresistive body 43, between the magnetoresistive body 43 and the wiring 9 that extends between the magnetoresistive body 43 and the magnetoresistive body 48 disposed to the left of the magnetoresistive body 43.

In FIG. 2, on the center position O side, one end portion of the open portion 7 extending along the equal side on the right bends toward the left to the connection portion between the magnetoresistive body 43 and the wiring 9. At the lower perimeter, another end portion of this open portion 7 bends toward the left as far as the perimeter-side connection portion between the magnetoresistive body 43 and the wiring 9. This open portion 7 has a substantially I-shaped profile in plan view. The open portion 7 extending along the equal side on the right is disposed alongside the magnetoresistive body 43, between the magnetoresistive body 43 and the wiring 9 that extends between the magnetoresistive body 43 and the magnetoresistive body 47 disposed to the right of the magnetoresistive body 43.

In this manner, in the present exemplary embodiment, the open portions 7 disposed running along the perimeter of the MR element M3 are divided into left and right about the connection portions between the magnetoresistive body 43 and the wirings 9.

As illustrated in FIG. 1, the configurations of the open portions 7 of the other MR elements, namely the MR element M1, MR element M2, and MR element M4 to MR element M8, are equivalent to the configuration of the open portion 7 disposed running along the perimeter of the MR element M3

As illustrated in FIG. 4, the open portions 7 are each configured including a first open portion 71 and a second open portion 72 that is in communication with the first open portion 71.

The first open portion 71 is formed in the second protective film 52 of the protective film 5, and is formed penetrating the second protective film 52 in the thickness direction thereof. Isotropic dry etching is, for example, employed in a manufacturing process for the magnetic sensor 1 to form the first open portion 71.

The second open portion 72 is formed in the protective film 10 at a placement position aligned with the placement position of the first open portion 71 in plan view, and is formed penetrating the protective film 10 in the thickness direction thereof. Similarly to the first open portion 71, isotropic dry etching is employed to form the second open portion 72.

The minimum trench width dimension at the side of the open portion 7 adjacent to the insulator 3 is, for example, set from 3 μm to 5 μm. Also note that in the manufacturing process for the magnetic sensor 1, the second open portion 72 is formed in the same manufacturing step as the bonding openings mentioned above.

As illustrated in FIG. 3 and FIG. 4, in the MR element M3, a separation distance L1 between an inside wall of the open portion 7 and magnetoresistive body 43, this being the minimum distance with respect to the magnetoresistive body 43, is configured so as to be longer than an alignment margin dimension of the open portion 7 with respect to the magnetoresistive body 43. In addition to the MR element M3, the separation distance L1 between the magnetoresistive bodies 4 and the open portions 7 is similarly configured so as to be longer than the alignment margin dimension for the MR elements MR element M1, MR element M2, and MR element M4 to MR element M8.

Note that the separation distance L1 is a separation distance in a direction orthogonal to the extension direction of the magnetoresistive body 43 and the open portion 7 at a location where the magnetoresistive body 43 and this open portion 7 extend parallel to one another. The alignment margin dimension is a margin dimension provided such that two patterns do not overlap even if misalignment occurs in the manufacturing process for the magnetic sensor 1. The alignment margin dimension of the open portion 7 with respect to the magnetoresistive body 43 is from 3 μm to 4 μm.

Figure 5:
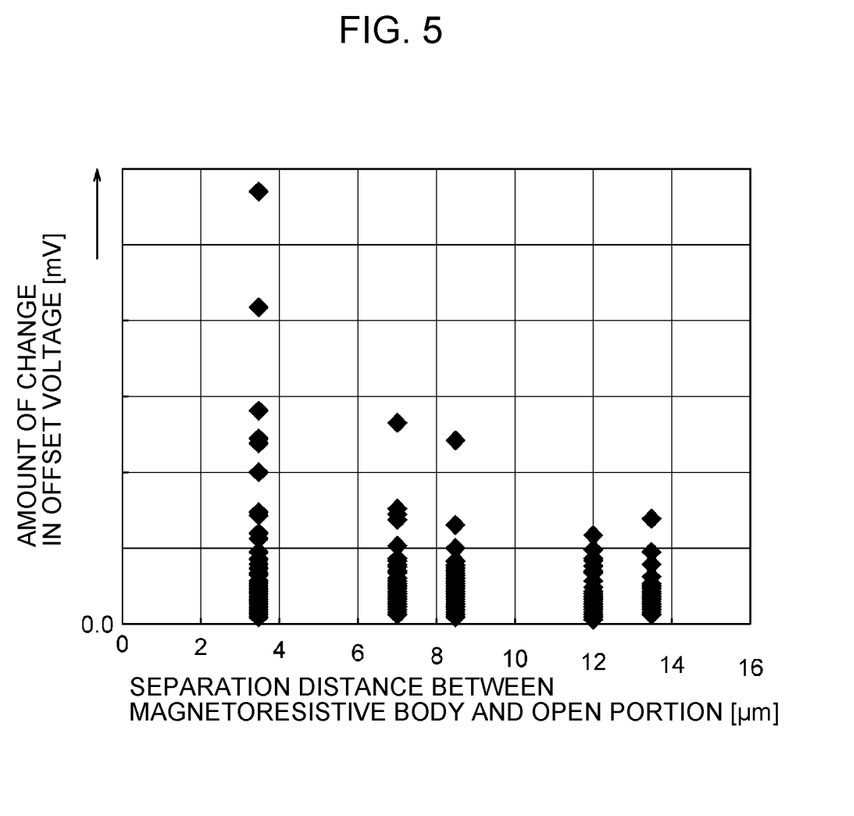
FIG. 5 is a graph illustrating relationships between a separation distance between a magnetoresistive body and an open portion, and an amount of change in offset voltage, in the magnetic sensor according to the first exemplary embodiment.

FIG. 5 illustrates a relationship between the separation distance L1 between the magnetoresistive bodies 4 and the open portions 7 and an amount of change in the offset voltage of the magnetic sensor 1. The horizontal axis represents the separation distance L1 (μm). The vertical axis represents the amount of change in offset voltage (variation in durability) (mV).

As illustrated in FIG. 5, there is a significant amount of change in the offset voltage when the separation distance L1 is within the range of the alignment margin dimension. When the separation distance L1 is greater than 7 μm, the amount of change in the offset voltage is much reduced, and the amount of change in offset voltage becomes more stable.

Operation and Advantageous Effects of the Present Exemplary Embodiment

As illustrated in FIG. 4, in the magnetic sensor 1 according to the present exemplary embodiment, the magnetoresistive bodies 4 are disposed on the surface of the insulator 3, and the protective film 5 and the protective film 10 are provided on the surface of the insulator 3, including over the magnetoresistive bodies 4. As illustrated in FIG. 1 to FIG. 3, the open portions 7 are provided in the protective film 5 and the protective film 10 running along at least a portion of the perimeter of each magnetoresistive body 4. As illustrated in FIG. 4, the open portions 7 penetrate the protective film 5 and the protective film 10 in the thickness direction thereof.

As illustrated in FIG. 3 and FIG. 4, the separation distance L1 between the inside walls of the open portions 7 and the magnetoresistive bodies 4, this being the minimum distance with respect to the magnetoresistive bodies 4, is configured so as to be longer than the alignment margin dimension of the open portions 7 with respect to the magnetoresistive bodies 4. Namely, a path of ingress for moisture from the open portions 7 to the magnetoresistive bodies 4 along the interface between the insulator 3 and the second protective film 52 of the protective film 5 in particular, is lengthened.

As illustrated in FIG. 5, as the separation distance L1 between the magnetoresistive bodies 4 and the open portions 7 becomes longer, an amount of change in offset voltage becomes smaller. This enables moisture ingress to be effectively suppressed or prevented, and enables variation in the durability of the characteristics of the magnetic sensor 1 to be minimized.

Further, in the magnetic sensor 1 according to the present exemplary embodiment, as illustrated in FIG. 5, the separation distance L1 between the inside walls of the open portions 7 and the magnetoresistive bodies 4 is greater than or equal to 7 μm, thus enabling moisture ingress from the open portions 7 to the magnetoresistive bodies 4 to be effectively suppressed.

In particular, in cases in which the separation distance L1 is configured in the range of from 8 μm to 12 μm, the amount of change in the offset voltage is even further reduced, and since the separation distance L1 is not particularly large, the degree of integration of the magnetic sensor 1 is able to be improved.

Second Exemplary Embodiment

Explanation follows regarding a magnetic sensor according to a second exemplary embodiment of the present invention, with reference to FIG. 6 to FIG. 9B. Note that in the explanation of the second exemplary embodiment, configuration elements that are the same as, or effectively the same as, configuration elements already explained in the first exemplary embodiment are given the same reference sign, and duplicate explanation thereof will not be given.

Magnetic Sensor Layout Configuration

Figure 6:
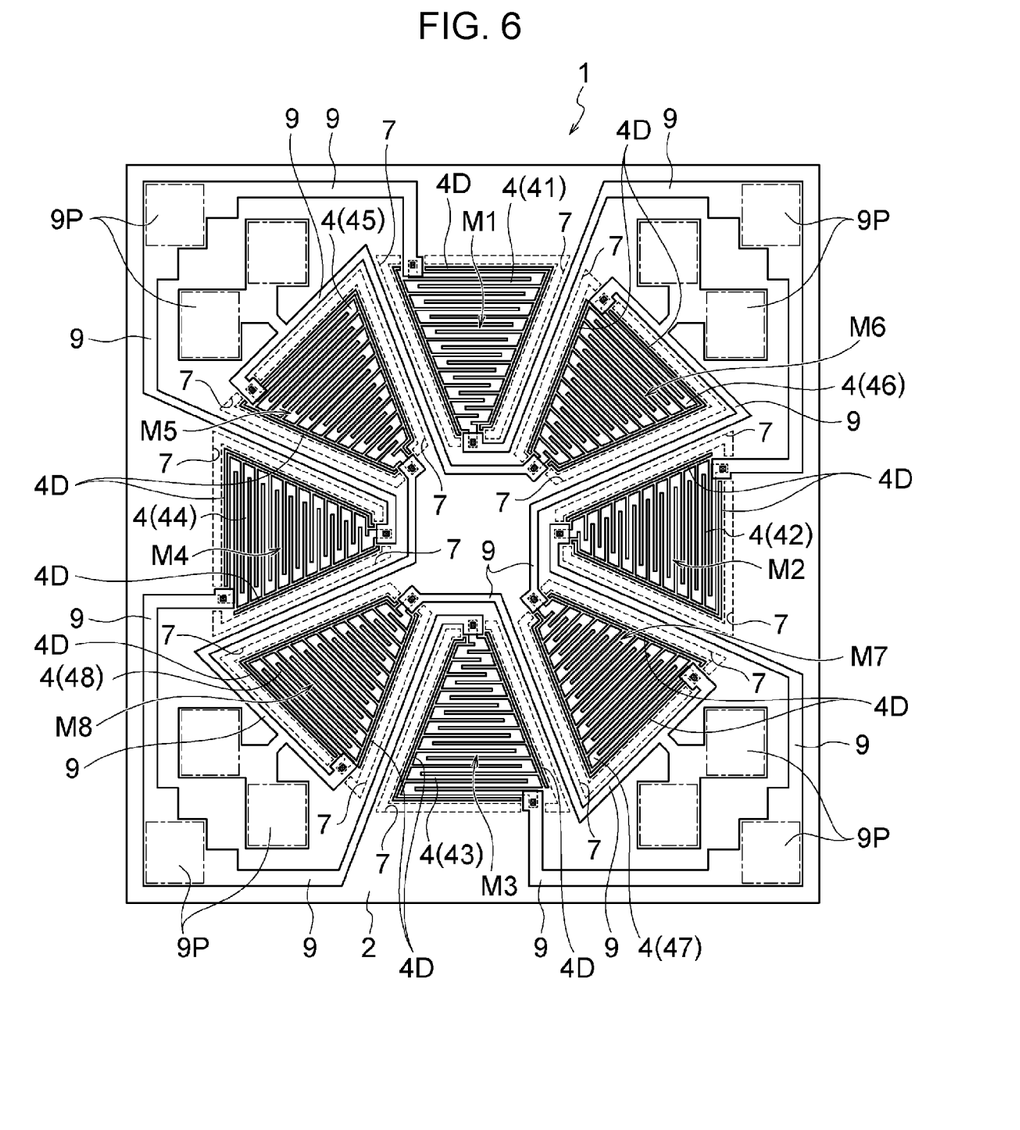
FIG. 6 is a plan view illustrating the overall layout of a magnetic sensor according to a second exemplary embodiment of the present invention.

As illustrated in FIG. 6, a magnetic sensor 1 according to the present exemplary embodiment has the same basic configuration as the configuration of the magnetic sensor 1 according to the first exemplary embodiment, illustrated in FIG. 1. Namely, the magnetic sensor 1 includes MR elements M1 to M4 configuring a first bridge circuit, includes MR elements M5 to M8 configuring a second bridge circuit, and open portions 7 are disposed running along the perimeter of each of the MR elements M1 to M8.

Figure 7:
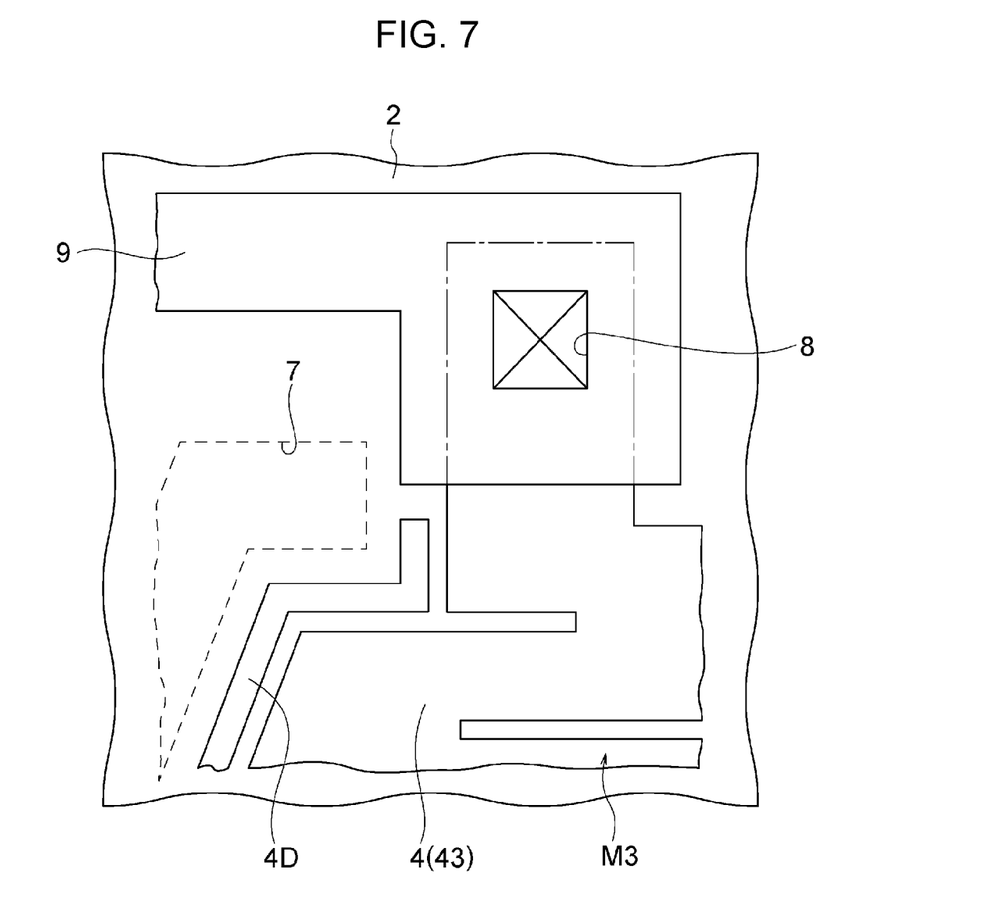
FIG. 7 is an enlarged plan view, corresponding to FIG. 3, illustrating relevant portions of part of the magnetic sensor illustrated in FIG. 6.
Figure 8:
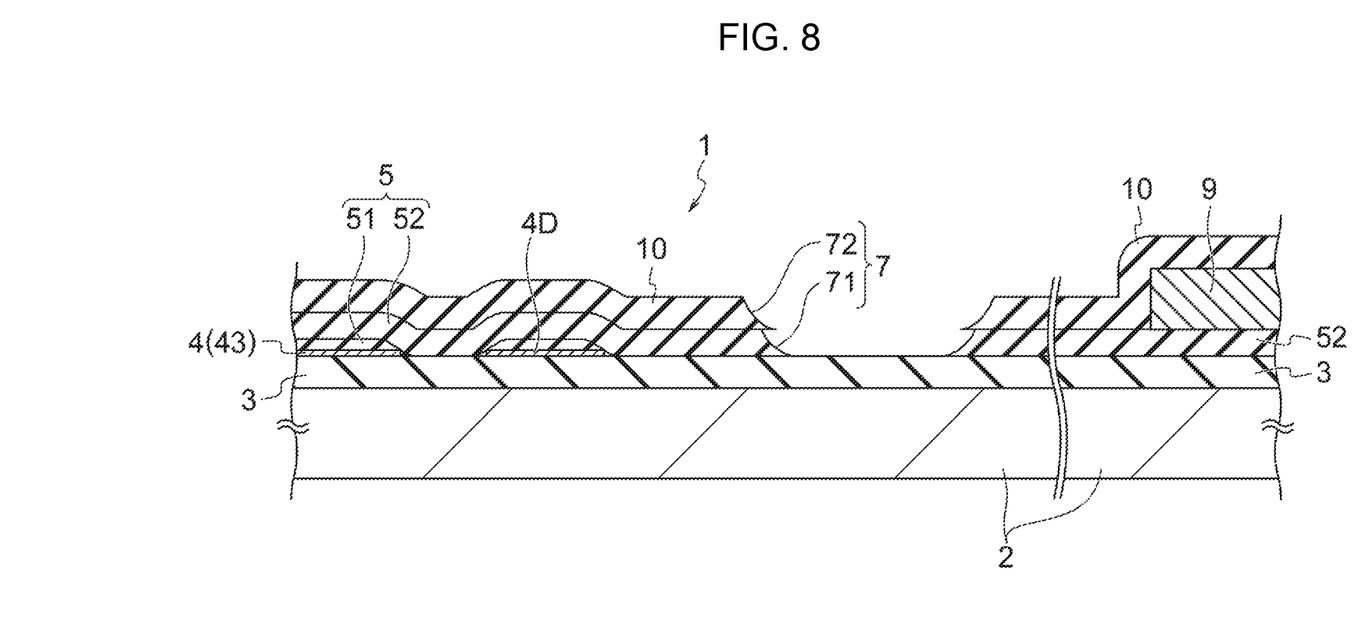
FIG. 8 is an enlarged cross-section view, corresponding to FIG. 4, illustrating relevant portions of the magnetic sensor illustrated in FIG. 7.

As illustrated in FIG. 6 to FIG. 8, in the magnetic sensor 1 according to the present exemplary embodiment, dam portions 4D are disposed at intermediate positions between the magnetoresistive bodies 4 and the open portions 7 of each of the MR elements M1 to M8.

To explain in more detail, as illustrated in FIG. 8, each dam portion 4D is formed between the insulator 3 and the protective film 5, in the same electrically conductive layer as the magnetoresistive bodies 4, in a structuring or manufacturing process of the magnetic sensor 1. Due to being formed in the same electrically conductive layer, the dam portions 4D are formed from the same material as the magnetoresistive bodies 4. The first protective film 51 over the dam portions 4D for patterning the dam portions 4D is configured similarly to the first protective film 51 over the magnetoresistive bodies 4.

As illustrated in FIG. 7 and FIG. 8, the dam portions 4D extend along at least a portion of the perimeter of the respective magnetoresistive bodies 4 in a similar manner to the open portions 7, and are disposed at a uniform width dimension. Note that the expression "the dam portions 4D extend along at least a portion of the perimeter of the respective magnetoresistive bodies 4" is used to mean that the dam portions 4D extend along the majority of the perimeter of each magnetoresistive body 4, except for at the connection portions between the magnetoresistive bodies 4 and the wirings 9.

In the present exemplary embodiment, the width dimension of the dam portions 4D is, for example, set from 2 μm to 5 μm, and a separation dimension between the dam portions 4D and the magnetoresistive bodies 4 is set smaller than the separation dimension between the dam portions 4D and the open portions 7, for example to 2 μm. The separation dimension between the dam portions 4D and the open portions 7 is, for example, set from 3 μm to 4 μm, this being inclusive of the alignment margin dimension.

Figure 9A:
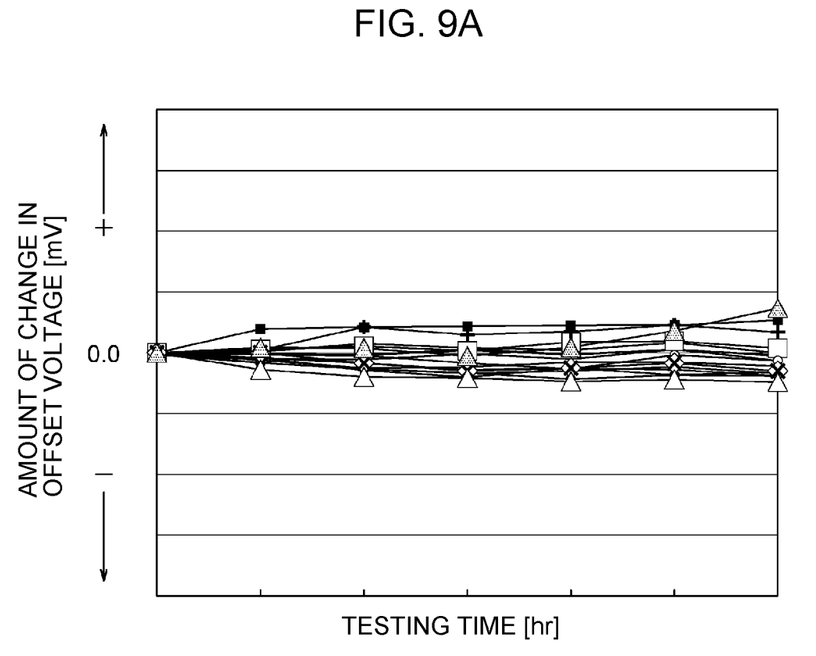
FIG. 9A is a graph illustrating relationships between testing time and an amount of change in offset voltage in the magnetic sensor according to the second exemplary embodiment.
Figure 9B:
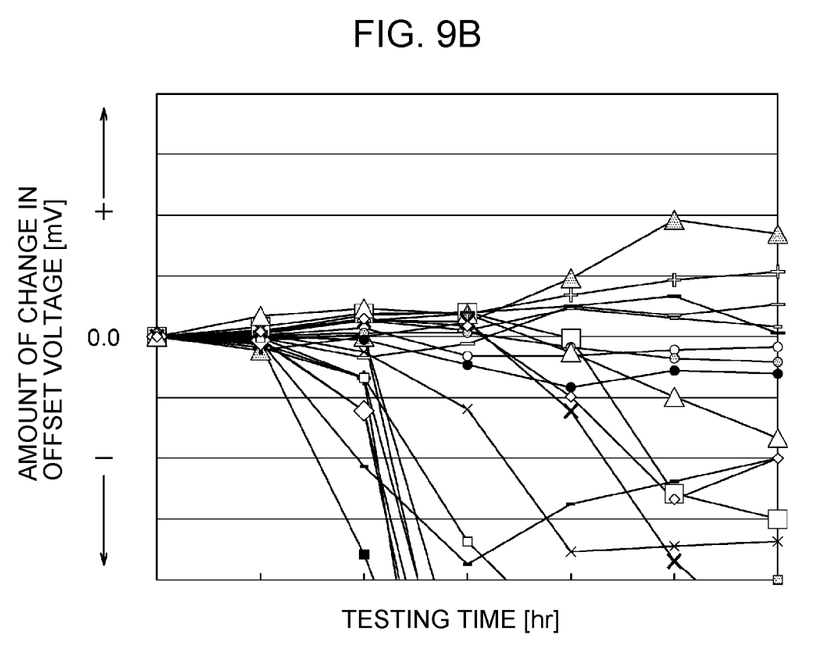
FIG. 9B is a graph illustrating relationships between testing time and an amount of change in offset voltage in a magnetic sensor according to a comparative example.

FIG. 9A illustrates the results of highly accelerated life tests of the magnetic sensor 1 according to the present exemplary embodiment. FIG. 9B illustrates the results of highly accelerated life tests of a magnetic sensor according to a comparative example. In the magnetic sensor according to the comparative example, the separation distance between magnetoresistive bodies of MR elements and open portions is the same as the separation distance between the dam portions 4D and the open portions 7 of the magnetic sensor according to the present exemplary embodiment. A pressure cooker test (PCT) carried out under saturated conditions was employed for the highly accelerated life tests. The testing conditions were as follows: a temperature of 121° C.; a humidity of 100%; a pressure of 1.2 atm; and a testing time of 600 hours. 100 temperature cycles were applied every 100 hours. The temperature range was from −40° C. to 105° C. The number of samples taken was 22. The horizontal axis represents testing time (hr) and the vertical axis represents the amount of change in the offset voltage (mV).

As illustrated in FIG. 9B, in the magnetic sensor according to the comparative example, when the testing time exceeded the 100 hour mark, a large number of samples exhibited a negative swing in the offset voltage. When the testing time exceeded the 400 hour mark, although some samples exhibited a positive swing in the offset voltage, overall, there was a large amount of variation in the durability of the offset voltage of the magnetic sensor according to the comparative example.

In contrast to the magnetic sensor according to the comparative example, as illustrated in FIG. 9A, the magnetic sensor 1 according to the present exemplary embodiment exhibits little change in offset voltage, even after hundreds of hours of testing time.

Operation and Advantageous Effects of Present Exemplary Embodiment

As illustrated in FIG. 8, in the magnetic sensor 1 according to the present exemplary embodiment, the magnetoresistive bodies 4 are disposed on the surface of the insulator 3, and the protective film 5 and the protective film 10 are provided on the surface of the insulator 3, including over the magnetoresistive bodies 4. As illustrated in FIG. 6 to FIG. 8, the open portions 7 are provided in the protective film 5 and the protective film 10 running along at least a portion of the perimeter of each magnetoresistive body 4. As illustrated in FIG. 8, the open portions 7 penetrate the protective film 5 and the protective film 10 in the thickness direction thereof.

As illustrated in FIG. 7 and FIG. 8, the dam portions 4D are disposed at intermediate positions between the magnetoresistive bodies 4 and the open portions 7, and between the insulator 3 and the protective film 5 (the second protective film 52). The dam portions 4D hold back the ingress of moisture from the open portions 7 to the magnetoresistive bodies 4 along the interface between the insulator 3 and the second protective film 52.

The dam portions 4D are thus disposed so as to enable the effective suppression or prevention of moisture ingress, enabling variation in the durability of the magnetic sensor 1 characteristics to be reduced as illustrated in FIG. 9A.

Further, in the magnetic sensor 1 according to the present exemplary embodiment, the dam portions 4D are formed in the same layer and from the same material as the magnetoresistive bodies 4, and so there is no need to provide a new configuration separate to the magnetoresistive bodies 4. This enables the structure of the magnetic sensor 1 to be kept simple.

Further, in a manufacturing process for the magnetic sensor 1 according to the present exemplary embodiment, although the overall manufacturing steps have not been specifically described, since the dam portions 4D and the magnetoresistive bodies 4 are able to be formed in the same manufacturing step, an increase in the number of manufacturing steps can be avoided.

Supplementary Explanation of the Exemplary Embodiments

The present invention is not limited to the above exemplary embodiments, and the following modifications are possible within a range not departing from the spirit of the present invention.

For example, in the present invention, in cases in which an insulating substrate such as a silicon carbide substrate, a glass substrate, or a resin substrate is employed as the substrate, since the substrate itself is an insulator, the insulator over the substrate may be omitted.

Further, although in the above exemplary embodiments only the MR elements configuring the bridge circuits were disposed on the substrate, the configuration of the present invention may be such that the MR elements and elements for building a circuit, such as transistors, resistors, and capacitors, may be disposed on a single substrate.

Further, in the present invention, anisotropic magnetoresistance (AMR) elements, giant magnetoresistance (GMR) elements, tunnel magnetoresistance (TMR) elements, or the like may be employed as the MR elements.

What is claimed is:
1. A magnetic sensor comprising:
a magnetoresistive body that is disposed over a surface of an insulator;

a protective film that is provided over a surface of the insulator, including over the magnetoresistive body; and an open portion that runs along at least a portion of a perimeter of the magnetoresistive body and penetrates the protective film in a thickness direction;

a separation distance between an inside wall of the open portion and the magnetoresistive body, this being a minimum distance with respect to the magnetoresistive body, is configured to be in a range of from 8 μm to 12 μm.

2. The magnetic sensor of claim 1, further comprising: a wiring that has one end portion connected to the magnetoresistive body and another end portion connected to an external terminal, and that extends along the perimeter of the magnetoresistive body; the open portion being arranged between the magnetoresistive body and the wiring.

3. The magnetic sensor of claim 1, further comprising:

a plurality of the magnetoresistive bodies disposed adjacent to one another; and wirings that each have one end connected to one of the plurality of adjacently disposed magnetoresistive bodies, and each have another end that extends between the plurality of adjacently disposed magnetoresistive bodies and is connected to an external terminal; the open portion being configured to include a first open portion that is arranged between one of the magnetoresistive bodies and the wirings, and a second open portion that is arranged between another of the plurality of adjacently disposed magnetoresistive bodies and the wirings.

4. The magnetic sensor of claim 1, wherein the magnetoresistive body is formed with an isosceles triangle shaped planar profile that spreads in a radial pattern in one direction while snaking back and forth.

5. The magnetic sensor of claim 4, wherein the open portion is disposed running along two equal sides and one bottom side of the magnetoresistive body formed in the isosceles triangle shape.

6. The magnetic sensor of claim 2, wherein the open portion is disposed running along the perimeter of the magnetoresistive body except for a connection portion between the magnetoresistive body and the wiring.

7. A magnetic sensor comprising:

a magnetoresistive body that is disposed over a surface of an insulator;

a protective film that is provided over a surface of the insulator, including over the magnetoresistive body;

an open portion that runs along at least a portion of a perimeter of the magnetoresistive body and penetrates the protective film in a thickness direction; and a dam portion that is disposed between the insulator and the protective film at an intermediate position between the magnetoresistive body and the open portion, so as to hold back the ingress of moisture from the open portion to the magnetoresistive body along an interface between the insulator and the protective film, wherein the dam portion is formed in the same layer as, and from the same material as, the magnetoresistive body.

* * * * *